(12) United States Patent
Kim et al.

(10) Patent No.: US 6,909,129 B2
(45) Date of Patent: Jun. 21, 2005

(54) MAGNETIC RANDOM ACCESS MEMORY

(75) Inventors: Chang Shuk Kim, Kyoungki-do (KR); Hyeok Je Jeong, Kyungsang Nam-Do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/287,383

(22) Filed: Nov. 4, 2002

(65) Prior Publication Data

US 2003/0117835 A1 Jun. 26, 2003

(30) Foreign Application Priority Data

Dec. 26, 2001 (KR) ........................................ 2001-84902

(51) Int. Cl.[7] .............................................. H01L 29/76
(52) U.S. Cl. ........................... 257/295; 257/3; 257/278; 365/97; 365/99; 365/158; 365/171; 365/173
(58) Field of Search ................................ 257/295, 278, 257/3; 365/158, 171, 173, 97, 99

(56) References Cited

U.S. PATENT DOCUMENTS

| | | | | |
|---|---|---|---|---|
| 5,930,164 A | * | 7/1999 | Zhu | ............................ 365/158 |
| 6,351,408 B1 | * | 2/2002 | Schwarzl et al. | ............ 365/158 |
| 6,473,336 B1 | * | 10/2002 | Nakajima et al. | ........... 365/171 |
| 6,504,752 B2 | * | 1/2003 | Ito | ............................. 365/158 |

FOREIGN PATENT DOCUMENTS

| | | |
|---|---|---|
| JP | 2001-217398 | 8/2001 |
| JP | 2001-236781 | 8/2001 |

* cited by examiner

*Primary Examiner*—Bradley Baumeister
*Assistant Examiner*—Douglas Menz
(74) *Attorney, Agent, or Firm*—Marshall, Gerstein & Borun LLP

(57) ABSTRACT

A magnetic random access memory includes a plurality of multi-layered memory structures that are formed within a single memory unit and connected in one of a series and a parallel configuration. Each of the plurality of multi-layered memory structures has a resistance that varies based on a magnetization direction of a ferromagnetic layer. A transistor is operatively coupled to each of the plurality of multi-layered memory structures to perform one of a memory read and a memory write operation based on a conduction state of the transistor.

3 Claims, 7 Drawing Sheets

MAGNETIC RANDOM ACCESS MEMORY

BACKGROUND

1. Technical Field

The invention relates generally to a magnetic random access memory (MRAM) and, more particularly, to an MRAM having a higher speed than static random access memory (SRAM), an integration density similar to that of dynamic random access memory (DRAM), and the properties of a nonvolatile memory such as flash memory.

2. Description of the Related Art

Semiconductor memory manufacturing companies have developed MRAM using a ferromagnetic material. Generally speaking, MRAM enables the reading and writing of digital information by forming multi-layer ferromagnetic thin films and sensing current variations based on the magnetization direction of the respective thin films. MRAM has a high speed, a low power consumption and a high integration density due to the special properties of the magnetic thin film and enables a nonvolatile memory operation similar to flash memory.

MRAM operates by using a giant magneto resistive GMR phenomenon or a spin-polarized magneto-transmission (SPMT) which is based on the manner in which spin influences electron transmission. MRAM based on GMR utilizes the phenomenon that resistance varies significantly when spin directions are different in two magnetic layers having a non-magnetic layer therebetween. On the other hand, MRAM based on SPMT utilizes the phenomenon that larger current transmission is generated when spin directions are identical in two magnetic layers having an insulating layer therebetween, thereby providing a magneto-transmission junction memory device. In any event, MRAM research is presently concentrated on the formation of multi-layer magnetic thin films and is not concerned with a unit cell structure and a peripheral sensing circuit.

FIG. 1 is a cross-sectional diagram illustrating a conventional MRAM. As shown in FIG. 1, a gate electrode 15, or first word line, is formed on a semiconductor substrate 11. A gate oxide film 13 is formed on an interface between the gate electrode 15 and the semiconductor substrate 11. Source and drain junction regions 17a and 17b are formed on the semiconductor substrate 11 at both sides of the first word line 15 to form a MOSFET, and a reference voltage line 19a and a first conductive layer 19b are formed to contact the source and drain junction regions 17a and 17b, respectively. The reference voltage line 19a and the first conductive layer 19b are formed simultaneously.

Thereafter, a first interlayer insulating film 21 is formed to planarize the top surface of the resultant structure, and a first contact plug 23 is formed to contact the first conductive layer 19b. A lower read layer 25, contacting the first contact plug 23, is formed by patterning a second conductive layer. A second interlayer insulating film 27 is formed on the top surface of the resultant structure and planarized to expose the upper portion of the lower read layer 25. A second word line or write line 29, is formed on one side of the second interlayer insulating film 27. A third interlayer insulating film 31 is formed to planarize the upper portion of the write line 29.

Thereafter, a contact hole is formed by removing the third interlayer insulating film 27 on an upper portion of the lower read layer 25, and a second contact plug 33 is formed in the contact hole to contact the lower read layer 25.

A seed layer 35 is formed on the third insulating layer 31 to contact the second contact plug 33. The seed layer 35 overlaps an upper portion of the second contact plug 33 and extends to overlap the upper portion of the write line 29.

A stacked structure includes a semi-ferromagnetic layer (not shown), a pinned ferromagnetic layer 39, a tunnel barrier layer 41 and a free ferromagnetic layer 43 are formed on the seed layer 35 to have a pattern size as large as the write line 29 and to overlap the write line 29, thereby forming a magnetic tunnel junction (MTJ) cell 49.

The semi-ferromagnetic layer prevents the magnetization direction of the pinned layer from being changed and, thus, the magnetization direction of the pinned ferromagnetic layer 39 is fixed in one direction. The magnetization direction of the free ferromagnetic layer 43 can be changed by generating a magnetic field, and information of '0' or '1' can be stored according to the magnetization direction of the free ferromagnetic layer 43.

A fourth interlayer insulating film 45 is formed over the resultant structure and planarized to expose the free ferromagnetic layer 45. An upper read layer, namely a bit line 47, is formed to contact the free ferromagnetic layer 45.

The unit cell of the MRAM includes one field effect transistor having the first word line 15 as a read line for reading information, the MTJ cell 49, the second word line 29, which is a write line that determines the magnetization direction of the MTJ cell 49 by forming an external magnetic field by applying a current, and the bit line 47, which is an upper read layer that detects the magnetization direction of the free layer by applying current to the MTJ cell 49 in a vertical direction.

During a read operation of the information from the MTJ cell 49, a voltage is applied to the first word line 15 to turn the field effect transistor on, and the magnetization direction of the free ferromagnetic layer 45 in the MTJ cell 49 is detected by sensing a magnitude of the current applied to the bit line 47.

During a write operation of the information in the MTJ cell 49, while maintaining the field effect transistor in an off state, the magnetization direction of the free ferromagnetic layer 45 is controlled by a magnetic field generated by applying current to the second word line 29 and to the bit line 47. When current is applied to the bit line 47 and the write line 29 at the same time, one cell at a vertical intersecting point of the two metal lines can be selected.

When the current flows in the MTJ cell 49 in a vertical direction, a tunneling current flows through an insulating layer. When the pinned ferromagnetic layer and the free ferromagnetic layer have the same magnetization direction, the tunneling current increases. On the other hand, when the pinned ferromagnetic layer and the free ferromagnetic layer have different magnetization directions, the tunneling current decreases. This is referred to as a tunneling magneto resistance (TMR) effect.

A decrease in the magnitude of the current due to the TMR effect is sensed and, thus, the magnetization direction of the free ferromagnetic layer is sensed, thereby detecting the information stored in the cell according to the magnetization direction.

As described above in the conventional MRAM, because the contact to the bit line is formed through the MTJ cell, the fabrication process is complicated, the resulting semiconductor memory device is not highly integrated due to an increased cell area and productivity is reduced.

SUMMARY OF THE INVENTION

An MRAM may include a plurality of resistance transfer devices connected in series or parallel to store multi-level data using a magneto-resistance device or phase transformation device as the resistance transfer device. The magneto-resistance device may be selected from the group consisting of an MTJ, an AMR, a GMR, a spin valve, a ferromagnetic substance/metal•semiconductor hybrid structure, a III-V group magnetic semiconductor composite structure, a metal/semiconductor composite structure, a semi-metal/semiconductor composite structure, and a colossal magneto-resistance (CMR).

In one aspect, an MRAM may include source and drain junction regions positioned in an active region of a semiconductor substrate; a stacked structure of a gate oxide film and a word line formed on a channel region between the source and drain junction regions; a reference voltage line connected to the source junction region; a seed layer having a first connected to the drain junction region; a first resistance transfer device cell formed at an upper portion of a second side of the seed layer; a second resistance transfer device cell formed on the seed layer between the first side of the seed layer and the first resistance transfer device cell; a first write line and a second write line respectively formed at a lower portion of the seed layer below the first resistance transfer device cell and the second resistance transfer device cell; and a bit line contacting the first resistance transfer device cell and the second resistance transfer device cell.

In another aspect, an MRAM may include source and drain junction regions positioned in an active region of a semiconductor substrate; a stacked structure of a gate oxide film and a word line formed on a channel region between the source and drain junction regions; a reference voltage line connected to the source junction region; a first seed layer having a first side connected to the drain junction region; a first resistance transfer device cell formed at an upper portion of a second side of the first seed layer; a first write line formed at a lower portion of the second side of the first seed layer; a bit line connected to the first resistance transfer device cell; a second resistance transfer device cell formed at an upper portion of the first resistance transfer device cell on the bit line; a second seed layer having a first side connected to the first seed layer and a second side connected to an upper portion of the second resistance transfer device cell; and a second write line formed at the upper portion of the second side of the second seed layer.

In yet another aspect, an MRAM may include source and drain junction regions positioned in an active region of a semiconductor substrate; a stacked structure of a gate oxide film and a word line formed on a channel region between the source and drain junction regions; a reference voltage line connected to the source junction region; a first seed layer having a first side connected to the drain junction region; a first resistance transfer device cell formed at an upper portion of a second side of the first seed layer; a first write line formed at a lower portion of the second side of the first seed layer; a first bit line connected to the first resistance transfer device cell; a second seed layer having a first side connected to the first seed layer on the first bit line; a second write line formed at a lower portion of the second side of the second seed layer; a second resistance transfer device cell formed at an upper portion of the second seed layer on the second write line; and a second bit line connected to the second resistance transfer device cell.

In yet another aspect, an MRAM may include source and drain junction regions positioned in an active region of a semiconductor substrate; a stacked structure of a gate oxide film and a word line formed on a channel region between the source and drain junction regions; a reference voltage line connected to the source junction region; a seed layer having a first side connected to the drain junction region; a first resistance transfer device cell formed at an upper portion of a second side of the seed layer; a second resistance transfer device cell formed on the seed layer between the first side of the seed layer and the first resistance transfer device cell; a first write line and a second write line respectively formed at a lower portion of the seed layer below the first resistance transfer device cell and the second resistance transfer device cell; and a first bit line and a second bit line respectively contacting the first resistance transfer device cell and the second resistance transfer device cell.

In yet another aspect, an MRAM may include source and drain junction regions positioned in an active region of a semiconductor substrate; a stacked structure of a gate oxide film and a word line formed on a channel region between the source and drain junction regions; a reference voltage line connected to the source junction region; a first seed layer having a first side connected to the drain junction region; a first resistance transfer device cell formed at an upper portion of a second side of the first seed layer; a first write line formed at a lower portion of the second side of the first seed layer; a first bit line connected to the first resistance transfer device cell; a second seed layer having a first side connected to the upper portion of the first bit line; a second write line formed at a lower portion of the second side of the second seed layer; a second resistance transfer device cell formed at an upper portion of the second seed layer on the second write line; and a second bit line connected to the second resistance transfer device cell.

In still another aspect, an MRAM may include source and drain junction regions positioned in an active region of a semiconductor substrate; a stacked structure of a gate oxide film and a word line formed on a channel region between the source and drain junction regions; a reference voltage line connected to the source junction region; a first seed layer having a first side connected to the drain junction region; a first resistance transfer device cell formed at an upper portion of a second side of the first seed layer; a first write line formed at a lower portion of the second side of the first seed layer; a first bit line connected to the first resistance transfer device cell; a second resistance transfer device cell formed at an upper portion of the first resistance transfer device cell on the first bit line; and a second bit line connected to the second resistance transfer device cell.

In still another aspect, a magnetic random access memory includes a plurality of multi-layered memory structures that are formed within a single memory unit and connected in one of a series and a parallel configuration. Each of the plurality of multi-layered memory structures has a resistance that varies based on a magnetization direction of a ferromagnetic layer. Additionally, the magnetic random access memory includes a transistor operatively coupled to each of the plurality of multi-layered memory structures to perform one of a memory read and a memory write operation based on a conduction state of the transistor.

DETAILED DESCRIPTION OF THE PREFERRED EMBODIMENTS

Figure 1:
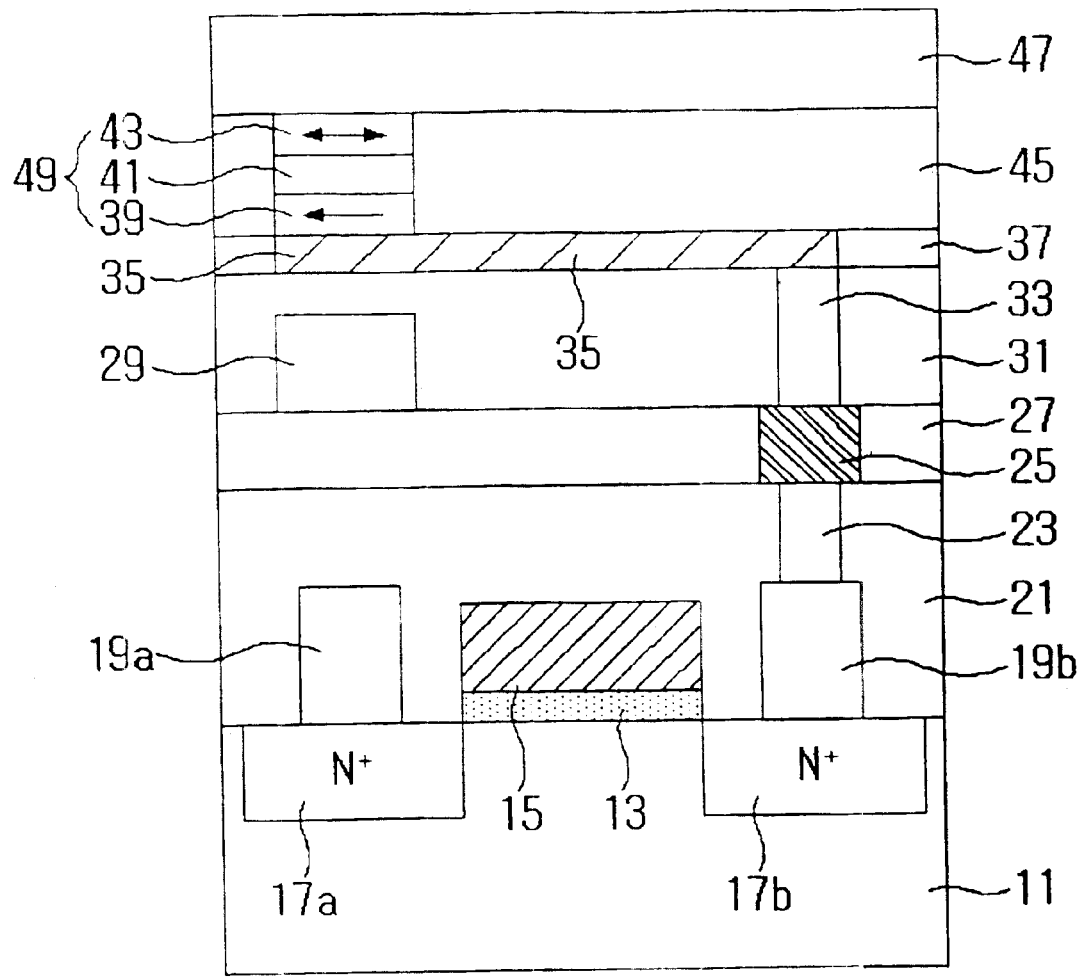
FIG. 1 is a cross-sectional diagram illustrating a conventional MRAM.
Figure 2:
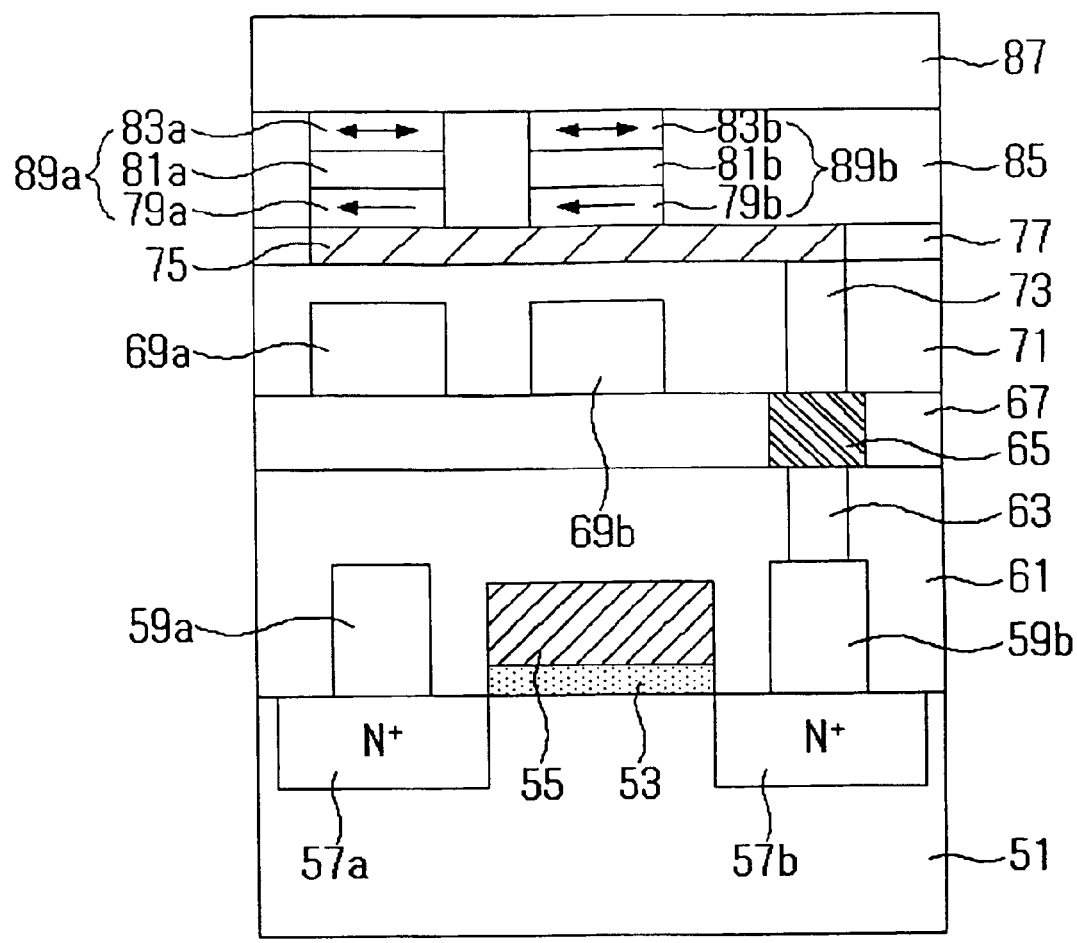
FIGS. 2 through 7 are cross-sectional diagrams that depict six exemplary MRAM structures made in accordance with the invention.

The exemplary MRAM shown in FIG. 2 includes: a semiconductor substrate 51; source and drain junction regions 57a and 57b provided at an active region of the semiconductor substrate 51; a stacked structure having a gate oxide film 53 and a word line 55 formed on a channel region between the source and drain junction regions 57a and 57b; a reference voltage line 59a connected to the source junction region 57a; a seed layer 75 having a first side connected to the drain junction region 59b; a first MTJ cell 89a formed at the upper portion of a second side of the seed layer 75; a second MTJ cell 89b formed on the seed layer 75 between the first side of the seed layer 75 and the first MTJ cell 89a; a first write line 69a and a second write line 69b respectively formed at the lower portion of the seed layer 75 below the first MTJ cell 89a and the second MTJ cell 89b; and a bit line 87 contacting the first MTJ cell 89a and the second MTJ cell 89b.

The MRAM shown in FIG. 2 requires one write line 69a or 69b in each MTJ cell to perform a write operation. Because the resistance has two values according to the magnetization direction of a free ferromagnetic layer of the MTJ cell, that is, to the direction being parallel to a magnetization direction of a pinned ferromagnetic layer, two bits can be stored in one cell when the two identical MTJ cells are used. In the case that the two MTJ cells have different resistance values, three bits can be stored in one cell. When more than three MTJ cells are connected in parallel, more bits can be stored in one cell.

Figure 3:
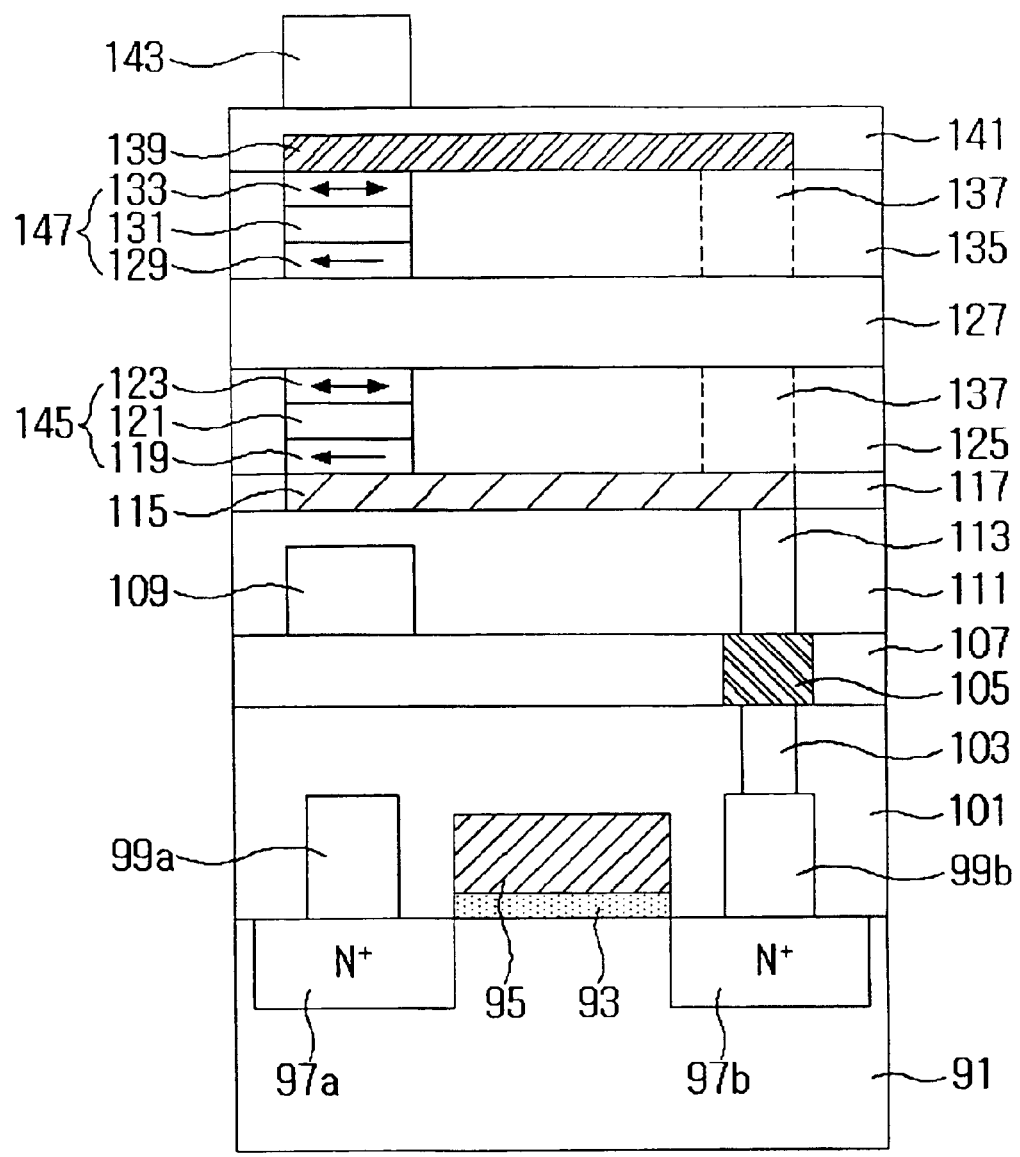

The exemplary MRAM shown in to FIG. 3 includes: a semiconductor substrate 91; source and drain junction regions 97a and 97b positioned in an active region of the semiconductor substrate 91; a stacked structure of a gate oxide film 93 and a word line 95 formed on a channel region between the source and drain junction regions 97a and 97b; a reference voltage line 99a connected to the source junction region 97a; a first seed layer 115 having a first side connected to the drain junction region 97b; a first MTJ cell 145 formed at the upper portion of a second side of the first seed layer 115; a first write line 109 formed at the lower portion of the second side of the first seed layer 115; a bit line 127 connected to the first MTJ cell 145; a second MTJ cell 147 formed at the upper portion of the first MTJ cell 145 on the bit line 127; a second seed layer 139 having a first side connected to the first seed layer 145, and a second side to the upper portion of the second MTJ cell 147; and a second write line 143 formed at the upper portion of one side of the second seed layer 139.

Figure 4:
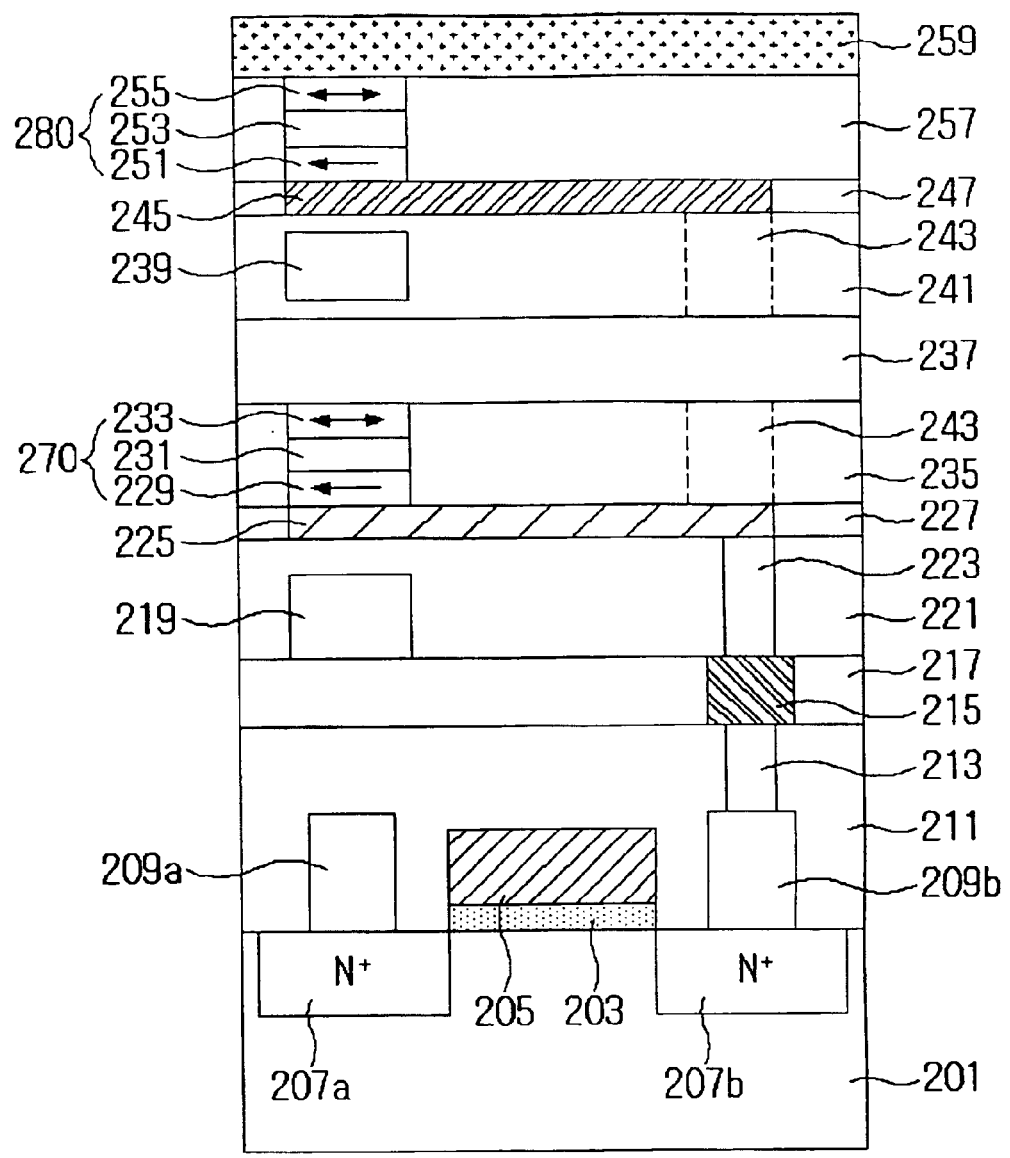

The exemplary MRAM shown in FIG. 4 includes: a semiconductor substrate 201; source and drain junction regions 207a and 207b positioned in an active region of the semiconductor substrate 201; a stacked structure of a gate oxide film 203 and a word line 205 formed on a channel region between the source and drain junction regions 207a and 207b; a reference voltage line 209a connected to the source junction region 207a; a first seed layer 225 having a first side connected to the drain junction region 209b; a first MTJ cell 270 formed at the upper portion of a second side of the first seed layer 225; a first write line 219 formed at the lower portion of the second side of the first seed layer 225; a first bit line 237 connected to the first MTJ cell 270; a second seed layer 245 having a first side connected to the first seed layer 225 on the first bit line 237; a second write line 239 formed at the lower portion of a second side of the second seed layer 245; a second MTJ cell 280 formed at the upper portion of the second seed layer 245 on the second write line 239; and a second bit line 259 connected to the second MTJ cell 280.

Figure 5:
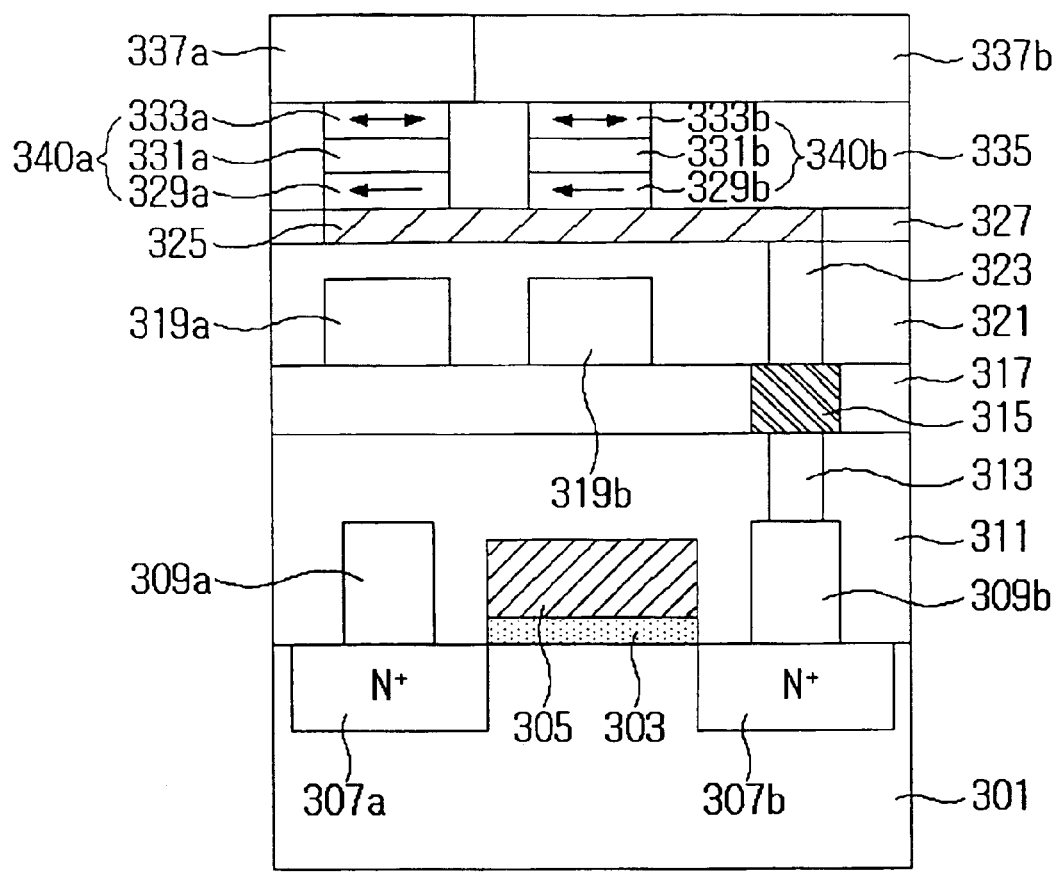

The exemplary MRAM shown in FIG. 5 includes: a semiconductor substrate 301; source and drain junction regions 307a and 307b positioned in an active region of the semiconductor substrate 301; a stacked structure of a gate oxide film 303 and a word line 305 formed on a channel region over the source and drain junction regions 307a and 307b; a reference voltage line 309a connected to the source junction region 307a; a seed layer 325 having a first side connected to the drain junction region 309b; a first MTJ cell 340a formed at the upper portion of a second side of the seed layer 325; a second MTJ cell 340b formed on the seed layer 325 between the first side of the seed layer 325 and the first MTJ cell 340a; a first write line 319a and a second write line 319b respectively formed at the lower portion of the seed layer 325 below the first MTJ cell 340a and the second MTJ cell 340b; and a first bit line 337a and a second bit line 337b respectively contacting the first MTJ cell 340a and the second MTJ cell 340b.

Figure 6:
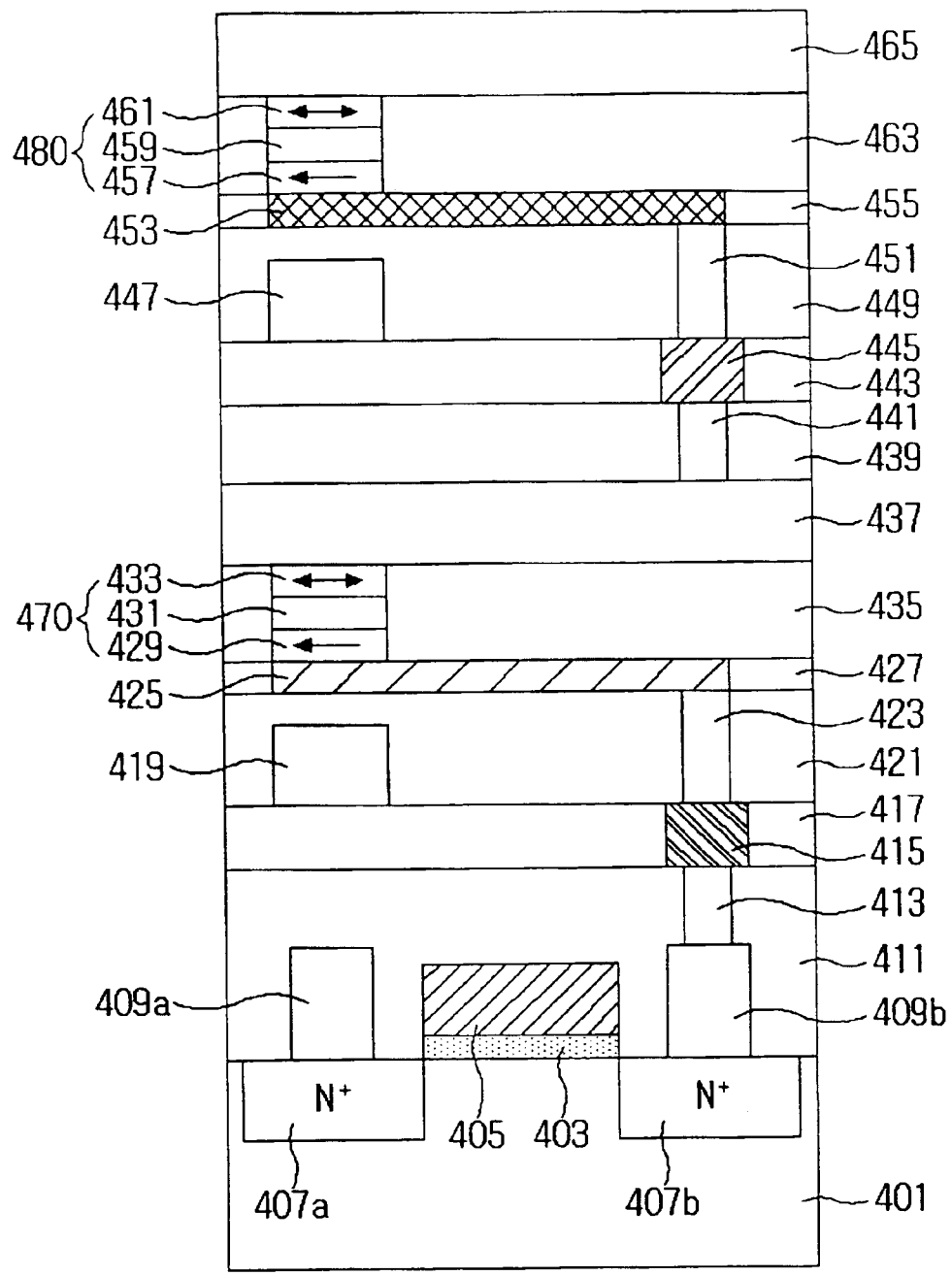

The exemplary MRAM shown in FIG. 6 includes: a semiconductor substrate 401; source and drain junction regions 407a and 407b positioned in an active region of the semiconductor substrate 401; a stacked structure of a gate oxide film 403 and a word line 405 formed on a channel region between the source and drain junction regions 407a and 407b; a reference voltage line 409a connected to the source junction region 407a; a first seed layer 425 having a first side connected to the drain junction region 409b; a first MTJ cell 470 formed at the upper portion of a second side of the first seed layer 425; a first write line 419 formed at the lower portion of the second side of the first seed layer 425; a first bit line 437 connected to the first MTJ cell 470; a second seed layer 453 having a first side connected to the upper portion of the first bit line 437; a second write line 447 formed at the lower portion of the second side of the second seed layer 453; a second MTJ cell 480 formed at the upper portion of the second seed layer 453 on the second write line 447; and a second bit line 465 connected to the second MTJ cell 480.

Figure 7:
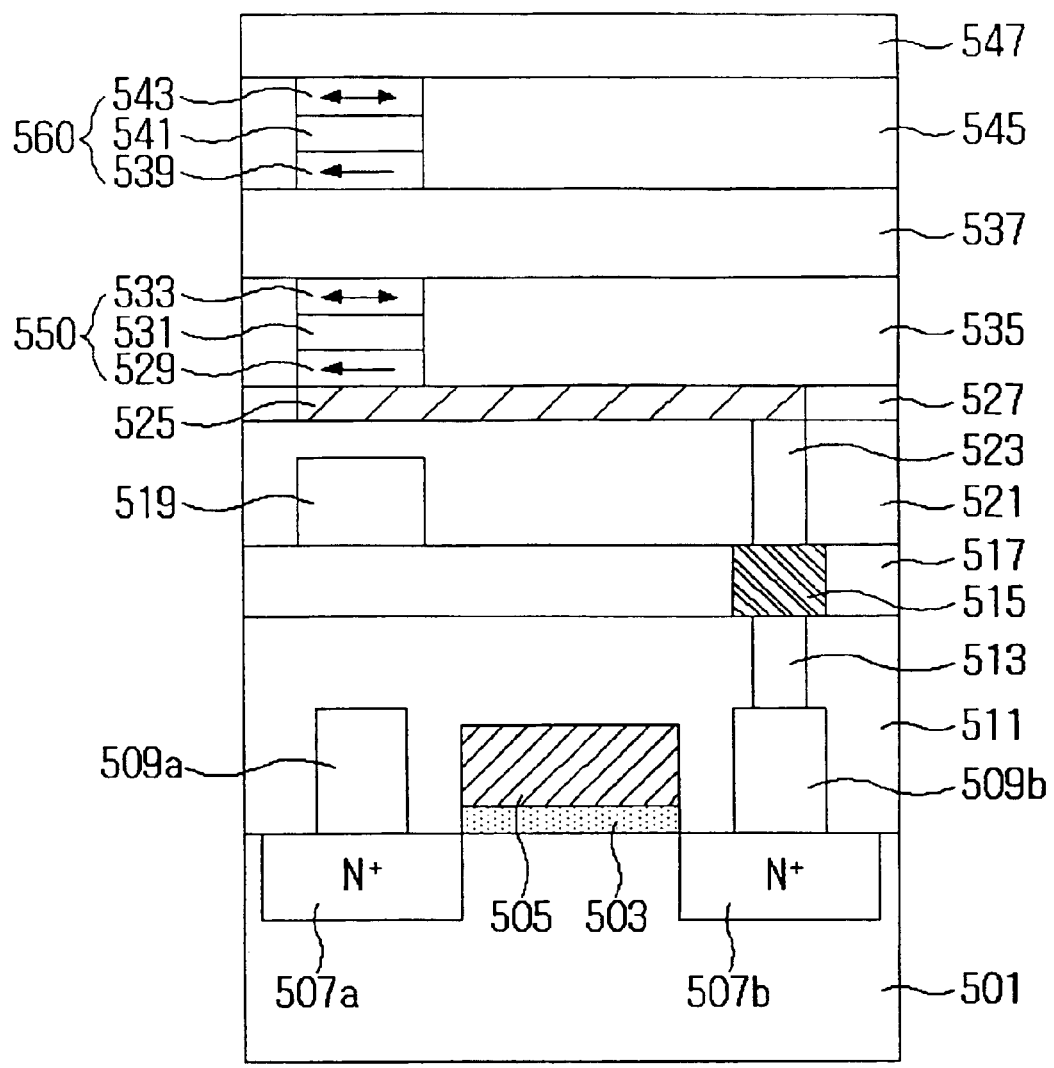

The exemplary MRAM shown in FIG. 7 includes: a semiconductor substrate 501; source and drain junction regions 507a and 507b positioned in an active region of the semiconductor substrate 501; a stacked structure of a gate oxide film 503 and a word line 505 formed on a channel region between the source and drain junction regions 507a and 507b; a reference voltage line 509a connected to the source junction region 507a; a first seed layer 525 having a first side connected to the drain junction region 509b; a first MTJ cell 550 formed at the upper portion of a second side of the first seed layer 525; a first write line 519 formed at the lower portion of the second side of the first seed layer 525; a first bit line 537 connected to the first MTJ cell 550; a second MTJ cell 560 formed at the upper portion of the first MTJ cell 550 on the first bit line 537; and a second bit line 547 connected to the second MTJ cell 560.

It is important to recognize that all kinds of magneto-resistance devices having a resistance that varies due to magnetization or magnetism, such as devices based on AMR, GMR, spin valve, ferromagnetic substance/metal semiconductor hybrid structure, III-V group magnetic semiconductor composite structure, metal(semi-metal)/semiconductor composite structure, or colossal magneto-resistance (CMR) or a phase transformation device that has resistance which varies according to material phase transformation due to an electric signal can be used instead of the MTJ cell. Additionally, the memory structures described herein can be applied to a magnetic field sensing device such as a magnetic hard disk head and a magnetic sensor.

The substructure of the MRAM includes the reference voltage line and the lower read layer respectively contacting the source and drain junction regions of the MOSFET.

As discussed earlier, the MRAM described herein is formed by using one transistor and a plurality of resistance transfer devices so that at least two bits can be stored in one cell. As a result, it is possible to highly integrate the device and improve reliability of the device.

As the invention may be embodied in several forms without departing from the spirit or essential characteristics thereof, it should also be understood that the invention is not limited by any of the details of the foregoing description, but rather should be construed broadly within its spirit and scope as defined in the appended claims, and therefore all changes and modifications that fall within the metes and bounds of the claims, or equivalences of such metes and bounds are intended to be embraced by the appended claims.

What is claimed is:

1. A magnetic random access memory, comprising:

a semiconductor substrate;

source and drain junction regions positioned in an active region of the semiconductor substrate;

a stacked structure of a gate oxide film and a word line formed on a channel region between the source and drain junction regions;

a reference voltage line connected to the source junction region;

a seed layer having a first side connected to the drain junction region;

a first resistance transfer device cell formed at an upper portion of a second side of the seed layer;

a second resistance transfer device cell formed on the seed layer between the first side of the seed layer and the first resistance transfer device cell;

a first write line and a second write line respectively formed at a lower portion of the seed layer below the first resistance transfer device cell and the second resistance transfer device cell; and a bit line contacting the first resistance transfer device cell and the second resistance transfer device cell to connect the first and second resistance transfer devices parallel in between the bit line and seed layer.

2. The magnetic random access memory according to claim 1, wherein the resistance transfer device includes one of a magneto-resistance device and a phase transformation device.

3. The magnetic random access memory according to claim 2, wherein the magneto-resistance device includes a device type selected from the group consisting of MTJ, AMR, GMR, spin valve, ferromagnetic substance/metal•semiconductor hybrid structure, III-V group magnetic semiconductor composite structure, metal/semiconductor composite structure, semi-metal/semiconductor composite structure, and colossal magneto-resistance.

* * * * *